US010760960B2

(12) United States Patent
Gnecchi et al.

(10) Patent No.: US 10,760,960 B2
(45) Date of Patent: Sep. 1, 2020

(54) COINCIDENCE RESOLVING TIME READOUT CIRCUIT

(71) Applicant: SensL Technologies Ltd., County Cork (IE)

(72) Inventors: Salvatore Gnecchi, Cork (IE); John Carlton Jackson, Cobh (IE); Edoardo Charbon, Neuchâtel (CH)

(73) Assignee: SENSL TECHNOLOGIES LTD., Cork (IE)

( * ) Notice: Subject to any disclaimer, the term of this patent is extended or adjusted under 35 U.S.C. 154(b) by 262 days.

(21) Appl. No.: 15/456,136

(22) Filed: Mar. 10, 2017

(65) Prior Publication Data

US 2018/0259391 A1    Sep. 13, 2018

(51) Int. Cl.

| G01J 1/44  | (2006.01) |
|---|---|
| G01T 1/29  | (2006.01) |
| H01L 27/146 | (2006.01) |
| H01L 31/107 | (2006.01) |

(52) U.S. Cl.
CPC .............. G01J 1/44 (2013.01); G01T 1/2985 (2013.01); H01L 27/14609 (2013.01); H01L 31/107 (2013.01); *G01J 2001/442* (2013.01); *G01J 2001/4466* (2013.01)

(58) Field of Classification Search
CPC .............. G01J 1/44; G01J 2001/442; G01J 2001/4466; G01T 1/2985; H01L 27/14609; H01L 31/107
See application file for complete search history.

(56) References Cited

U.S. PATENT DOCUMENTS

| 2012/0268105 | A1 | 10/2012 | Mann et al. |
|---|---|---|---|
| 2013/0214168 | A1 | 8/2013 | McDaniel et al. |
| 2015/0001404 | A1* | 1/2015 | Lau ........................ G01T 1/2006 |
| | | | 250/363.03 |
| 2015/0144797 | A1* | 5/2015 | Dolinsky .............. H01L 31/102 |
| | | | 250/366 |
| 2015/0309192 | A1* | 10/2015 | Coelho Dos Santos Varela ......... |
| | | | G01T 1/248 |
| | | | 250/370.06 |
| 2017/0179173 | A1* | 6/2017 | Mandai ............. H01L 27/14609 |

FOREIGN PATENT DOCUMENTS

WO    2016068492 A1    5/2016

OTHER PUBLICATIONS

International Search Report and Written Opinion for International Application No. PCT/EP2018/055741, dated Jun. 18, 2018, 10 pages.
E. Venialgo, N. Lusardi, A. Geraci, K. O'Neill, S Gnecchi, C. Jackson, S. E. Brunner, D. R. Schaart and E. Charbon; "An Order-Statistics-Inspired, Fully-Digital Readout Approach for Analog SiPM Arrays"; IEEE Nuclear Science Symposium, Medical Imaging Conference and Room-Temperature Semiconductor Detector Workshop; Oct. 29, 2016; 5 pages.

\* cited by examiner

*Primary Examiner* — Georgia Y Epps
*Assistant Examiner* — Don J Williams

(57) ABSTRACT

A coincidence resolving time readout circuit is described. An analog SiPM sensor for detecting photons and generating an SIPM output signal is provided. An ADC is configured to provide multiple threshold values for converting the analogue SiPM output signal to digital values. A time to digital converter configured to receive multiple digital values from the ADC and timestamp the digital values.

19 Claims, 5 Drawing Sheets

COINCIDENCE RESOLVING TIME READOUT CIRCUIT

FIELD OF THE INVENTION

The invention relates to a coincidence resolving time (CRT) readout circuit. In particularly but not exclusively the present disclosure relates to a CRT readout circuit for implementing a multi-threshold readout approach for CRT applications.

BACKGROUND

Silicon Photomultipliers (SPMs) are compact, high performance solid state detectors which are of growing importance for nuclear medicine and radiation detection systems. The disclosure presented herein uses SPM detectors and is of particular relevance to medical imaging scanners which use scintiliation radiation detection methods, such as Positron Emission Tomography (PET) including Time-of-Flight (TOF), gamma cameras and Positron Emission Mammography (PEM).

The quality of clinical images in these systems is dependent on many parameters including coincidence resolving time (CRT). Digital SiPMs exhibit a good photon resolution due to the digitization at the cell level of the received signal. However, this requires CMOS integration and affects the cell fill factor due to the inclusion of in-cell logics. Analogue SiPMs do not require internal logic since the output is the analogue sum of the current of each cell. The digitization is external, after the amplification stage. The traditional way to digitize the SiPM output consists in the use of a configurable single-threshold comparator which converts the SiPM output into digital pulses. However, this approach has the primary limitation of using a single threshold. When this is set at a low value, higher peaks of the signal, at high photon rates, are registered with the loss of information of the intensity, i.e. the photon number. For example, in a system with single-photon threshold, any two or three photon-events will be counted as single photon-events.

There is therefore a need to provide for a CRT readout circuit which addresses at least some of the drawbacks of the prior art.

SUMMARY

In one aspect a coincidence resolving time readout circuit is provided comprising:
- an analog SiPM sensor for detecting photons and generating an SIPM output signal;
- an ADC configured to provide multiple threshold values for converting the analogue SiPM output signal to digital values; and
- a time to digital converter configured to receive the digital values from the ADC and timestamp them.

In another aspect, an amplifier is provided for amplifying the SiPM output signal in advance of the SiPM signal being received by the ADC.

In one aspect, the ADC is a flash ADC.

In a further aspect, the ADC is configured to have a voltage range.

In another aspect, the voltage range is determined based on a plurality of parameters.

In a further aspect, at least one of the parameters is associated with a parameter of a CRT application.

In one aspect, at least one of the parameters is associated with a characteristic of a scintillator.

In a further aspect at least one of the parameters is associated with a characteristic of a laser pulse shape.

In one aspect, at least one of the parameters is associated with a bandwidth of an amplifier.

In another aspect, at least one of the parameters is associated with a dynamic range of the SiPM.

In one aspect, at least one of the parameters is associated with system jitter.

In a further aspect, the voltage range of the ADC is used to set the ADC resolution in addition to predefined CRT algorithm requirements.

In one aspect, the number of timestamps from the TDC is sufficient to reach an ideal Cramer limit.

In another aspect, all the timestamps from the TDC feed dedicated algorithms proven to reach the minimum CRT values.

In one aspect, the SiPM sensor is a single-photon sensor.

In a further aspect, the SiPM sensor is formed of a summed array of Single Photon Avalanche Photodiode (SPAD) sensors.

In another aspect, the SiPM sensor comprises a matrix of micro-cells.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION

Figure 1:
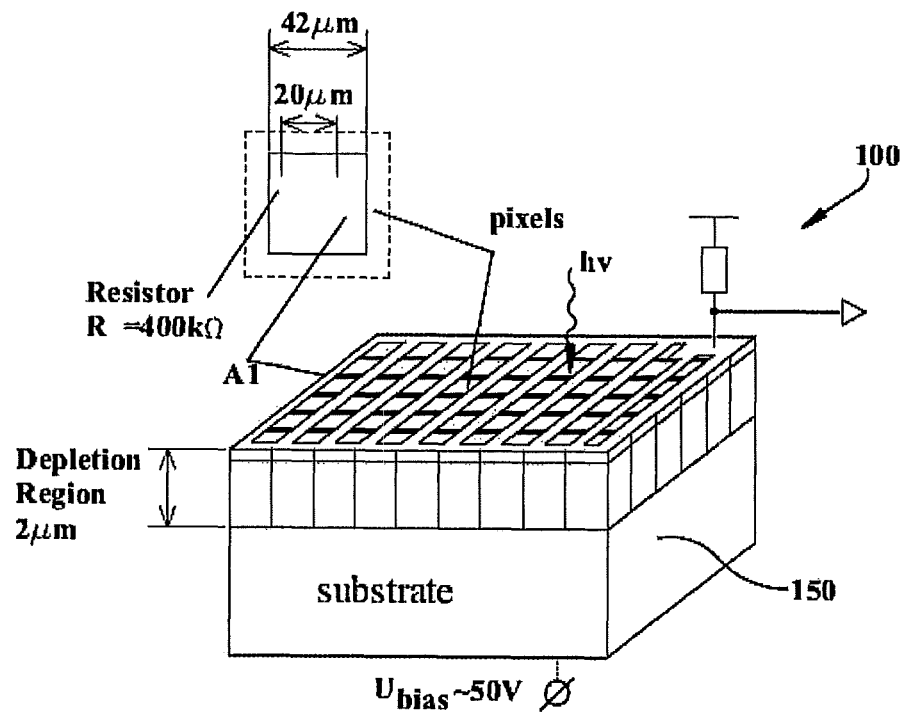
FIG. 1 illustrates an exemplary structure of a silicon photomultiplier.

The present disclosure will now be described with reference to an exemplary CRT readout circuit. It will be understood that the exemplary CRT readout circuit is provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Figure 2:
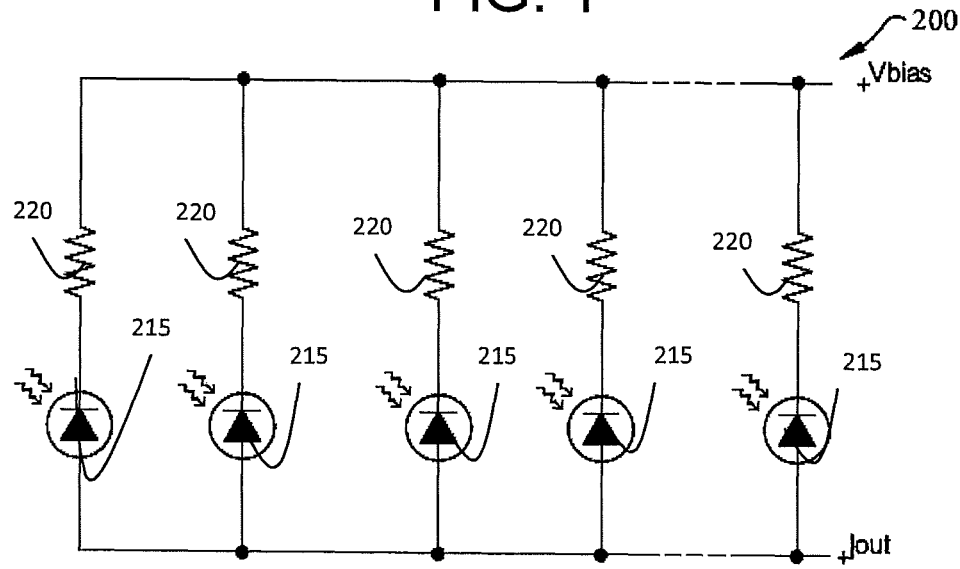
FIG. 2 is a schematic circuit diagram of an exemplary silicon photomultiplier.

Referring initially to FIG. 1, an analog silicon photomultiplier 100 comprising an array of Geiger mode photodiodes is shown. As illustrated, a quench resistor is provided adjacent to each photodiode which may be used to limit the avalanche current. The photodiodes are electrically connected to common biasing and ground electrodes by aluminium or similar conductive tracking. A schematic circuit is shown in FIG. 2 for a conventional silicon photomultiplier 200 in which the anodes of an array of photodiodes are connected to a common ground electrode and the cathodes of the array are connected via current limiting resistors to a common bias electrode for applying a bias voltage across the diodes.

The analog silicon photomultiplier 100 integrates a dense array of small, electrically and optically isolated Geiger-mode photodiodes 215. Each photodiode 215 is coupled in series to a quench resistor 220. Each photodiode 215 is referred to as a microcell. The number of microcells typically number between 100 and 3000 per mm². The signals of all microcells are then summed to form the analog output of the SiPM 200. A simplified electrical circuit is provided to illustrate the concept in FIG. 2. Each microcell detects photons identically and independently. The sum of the discharge currents from each of these individual binary detectors combines to form a quasi-analog output, and is thus capable of giving information on the magnitude of an incident photon flux.

Each microcell generates a highly uniform and quantized amount of charge every time the microcell undergoes a Geiger breakdown. The gain of a microcell (and hence the detector) is defined as the ratio of the output charge to the charge on an electron. The output charge can be calculated from the over-voltage and the microcell capacitance.

$$G = \frac{C \cdot \Delta V}{q}$$

Where:
G is the gain of the microcell;
C is the capacitance of the microcell;
$\Delta V$ is the over-voltage; and
q is the charge of an electron.

An SiPM sensor converts the detected laser photons and some detected photons due to noise to electrical signals that are then timestamped by timing electronics. The average number of detected photons k in a typical output pulse width $\tau$ is calculated from the incident rate $\Phi$ and the photon detection efficiency (PDE) as:

$$k = \Phi \times PDE \times \tau \quad \text{Equation 1}$$

Typically, the threshold for the digital readout of an SiPM is set to k to maximize the probability of detecting events. The probability of detecting X photon events when the average number is k is given by:

$$P(X) = e^{-k} \times \frac{k^X}{X!}$$

Figure 3:
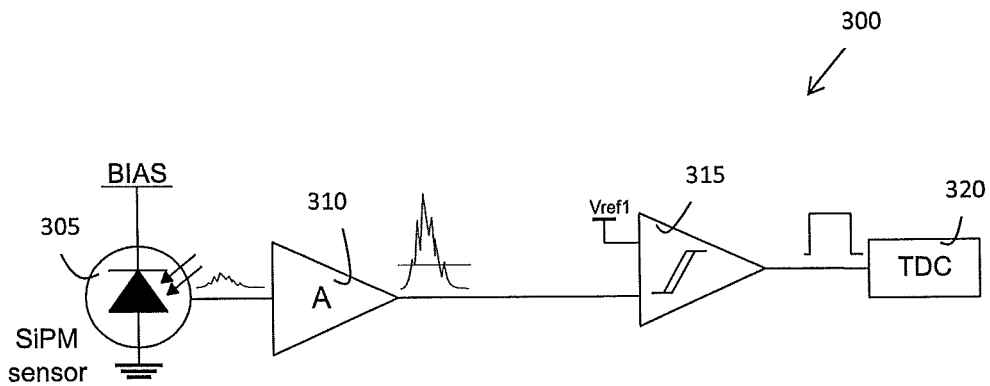
FIG. 3 illustrates a schematic of a prior art CRT readout circuit.
Figure 4:
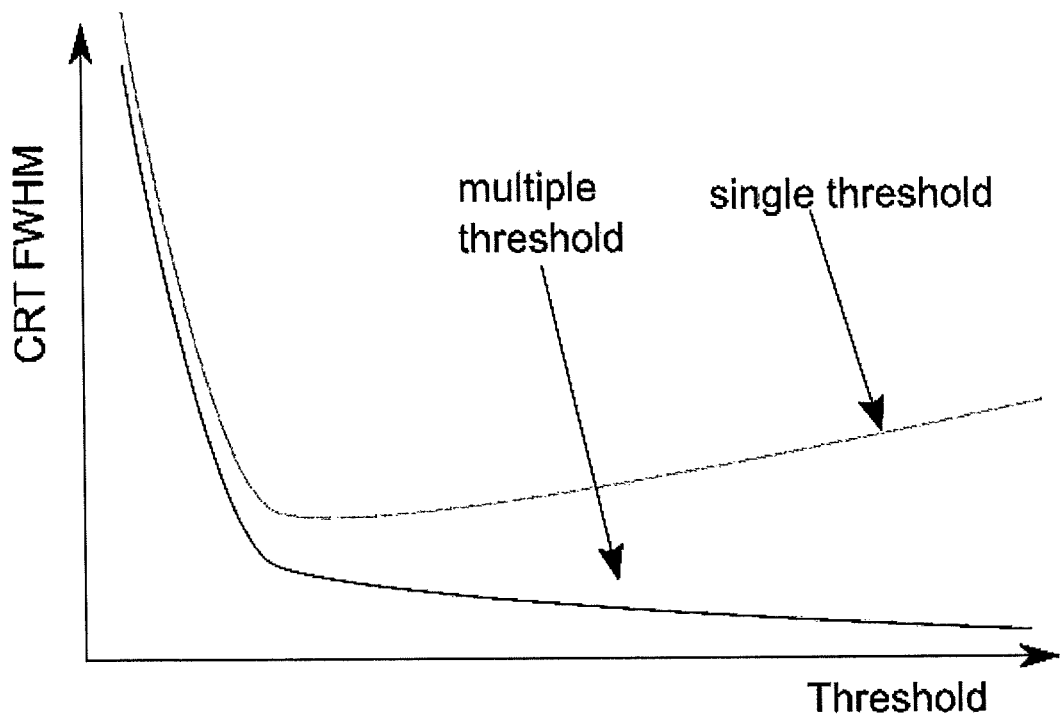
FIG. 4 is graph of a CRT output from CRT readout circuits.

Which has a maximum for X=k, as illustrated in FIG. 3. When a single threshold, using the comparator readout circuit of FIG. 4, is set to a certain value h, the single event per pulse is registered with a probability given by:

$$P(X \geq h) = 1 - e^{-k} \sum_{i=0}^{\lfloor h \rfloor} \frac{k^i}{i!}$$

All the events occurring with probability $P(X \geq h')$ when h'>h will not be distinguished and therefore not counted (or timed) as separate events.

Referring to FIG. 3 which illustrates a prior art CRT readout circuit 300. The CRT readout circuit 300 comprises an SiPM detector 305, an amplifier 310, a comparator 315 and a Time-digital-converter (TDC) 320. The SiPM sensor 305 may be employed in Coincidence Resolved Time measurements for PET applications. In a typical PET system, two 511 keV photons are emitted from the body which are approximately 180 degrees out of phase with one another. The single high energy photon is converted to a number of lower energy photons in the visible spectrum which are detected using a standard photomultiplier tube (PMT) in the current state of the art. For LSO approximately 20,000 to 30,000 lower energy visible wavelength photons are emitted for each of the 511 keV photons incident on the crystal. The decay time of the LSO output is approximately 40 ns. The challenge for the detection system in a PET system is two fold. First the detectors must be of sufficient high detection efficiency to be able to convert the photons into a measurable response to allow sufficient photons to be obtained. Second the detector must be sufficiently fast to allow the detection of the incident optical pulse with sufficient accuracy to allow the pulse to be measured and analysed. Thus the detector must be fast. Coincidence resolving time is the time resolution that is obtained from detecting the coincidence between the two photons emitted during a positron annihilation in PET. Because of the speed of light which is a constant given by $c=3\times10^8$ m/s the detector, including both the scintallator crystal and the optical detector must be suitably fast to allow detection of the pulses under with a resolution under 500 ps. This fast resolution is required to allow position of the photon emission to be resolved to a 7.5 cm resolution. To increase the resolution, faster detectors are required. It is possible to increase the resolution through repetitive measurements and signal processing, but this slows the data acquisition process and decreases overall system performance. High timing resolution detectors are therefore a requirement for PET. To perform this coincidence timing requires both a fast scintillator crystal, for high energy to lower energy conversion, and a subsequently fast and accurate readout circuits with the ability to reconstruct the output pulse from the crystal.

Figure 5:
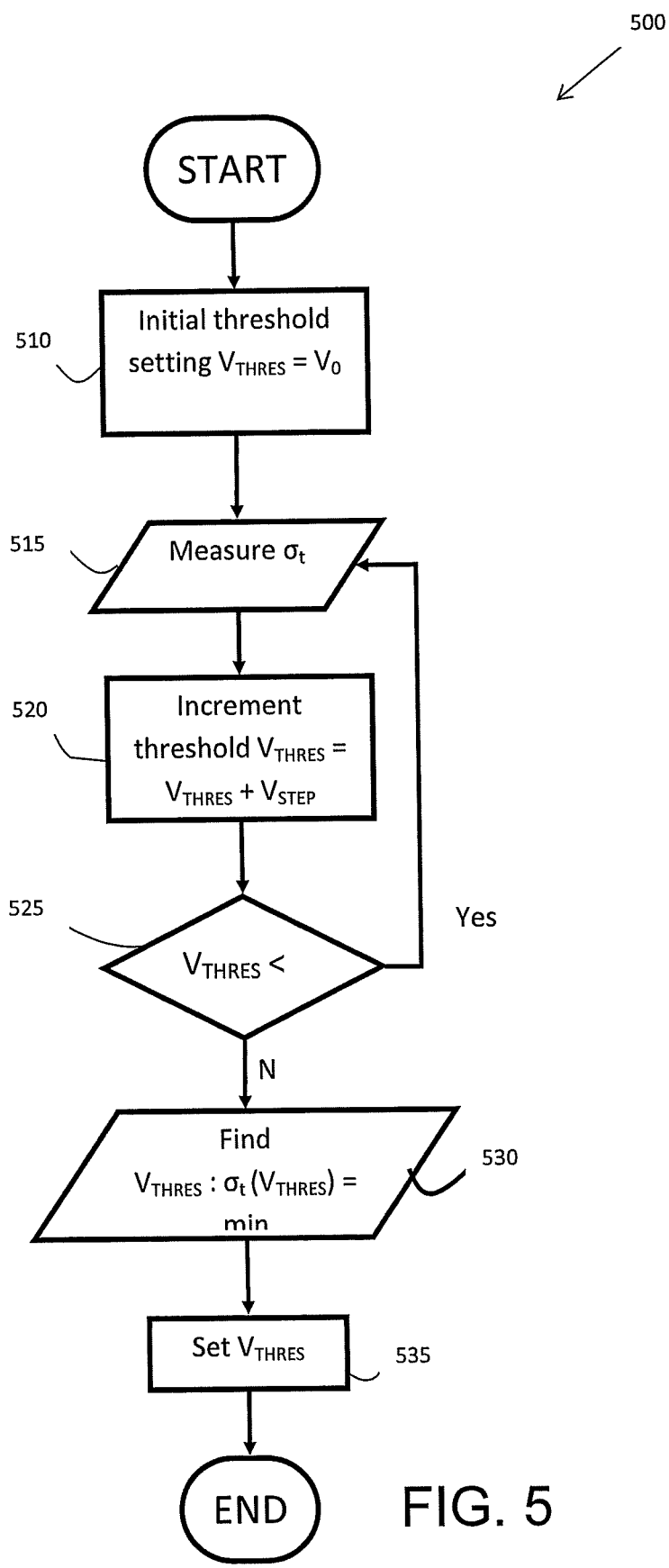
FIG. 5 is a flow chart illustrating exemplary steps of the prior art CRT readout circuit in operation.

In CRT readout circuits known heretofore the SiPM 305 may be used to provide an optical detector as illustrated in FIG. 3. The SiPM output is typically connected to the comparator 315 which allows the recording of the time when the SiPM signals exceeds a fixed threshold. The threshold of the comparator 315 is required to be calculated and fixed in advance of operating the readout circuit 300 which delays the speed at which data may be acquired. The readout circuit 300 may be utlised in single threshold approach, and the choice of the threshold value is set to an optimal value which minimise the CRT full width half maximum (FWHM), as shown in the dotted line in graph of FIG. 4. The flowchart of FIG. 5 illustrates exemplary steps for setting the optimum threshold value for readout circuit 300. An initial voltage level threshold is set to V0, block 510. CRT standard deviation is then measured for V0, block 515. The threshold is then incremented by the step of interest, block 520. The CRT standard deviation is remeasured and this loop continues until the upper limit of the threshold if reached, 525. Once all the values of the CRT standard deviation are collected, block 530, the threshold value giving the minimum CRT is selected, block 535.

Figure 6:
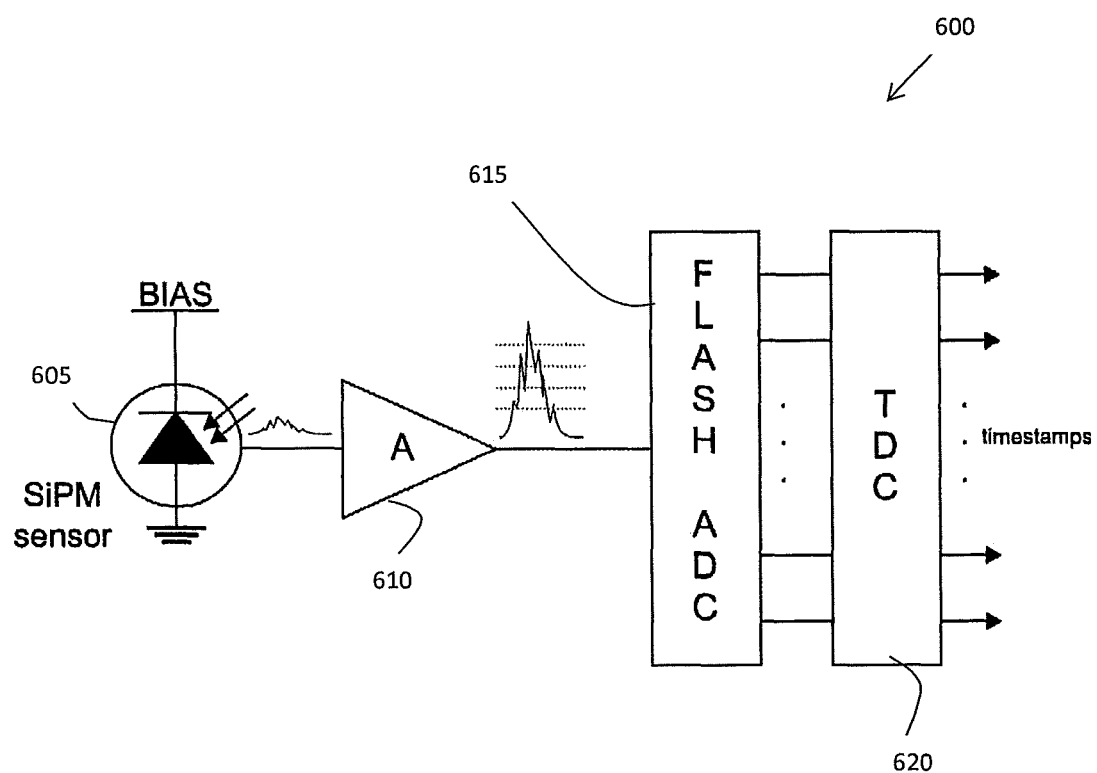
FIG. 6 is a schematic circuit diagram of an CRT readout circuit in accordance with the present teaching.

Referring to FIG. 6 which illustrates a CRT readout circuit 600 in accordance with the present teaching. The CRT readout circuit 600 comprises an analog SiPM 605 which operates as an optical detector. An amp lifer 610 amplifies the analog output signal from the SiPM 605. A flash ADC 615 is operable for converting the amplified SiPM analog output signal to digital values. The TDC 620 provides timing circuitry which time stamps the digital values from the ADC 615. The CRT readout circuit 600 implements a multi threshold approach by appropriately configuring the ADC 615 to have multiple threshold levels which are used for converting the analog SiPM output signal to digital values which are then relayed to the TDC 620. The inventors realised that setting the optimum threshold level as described in the flowchart of FIG. 5 was slow which limited the ability of the readout circuit 300 for fast readout applications such as CRT applications. The readout circuit 600 addressed this problem by preconfiguring the ADC 615 to have multiple threshold levels. As a consequence, the readout circuit 600 does not require a sweep to be performed as indicated in the flowchart of FIG. 5 in order to set the threshold value since automatically all the threshold values from the ADC are available in parallel. Therefore the threshold value giving minimum CRT is always available.

Figure 7:
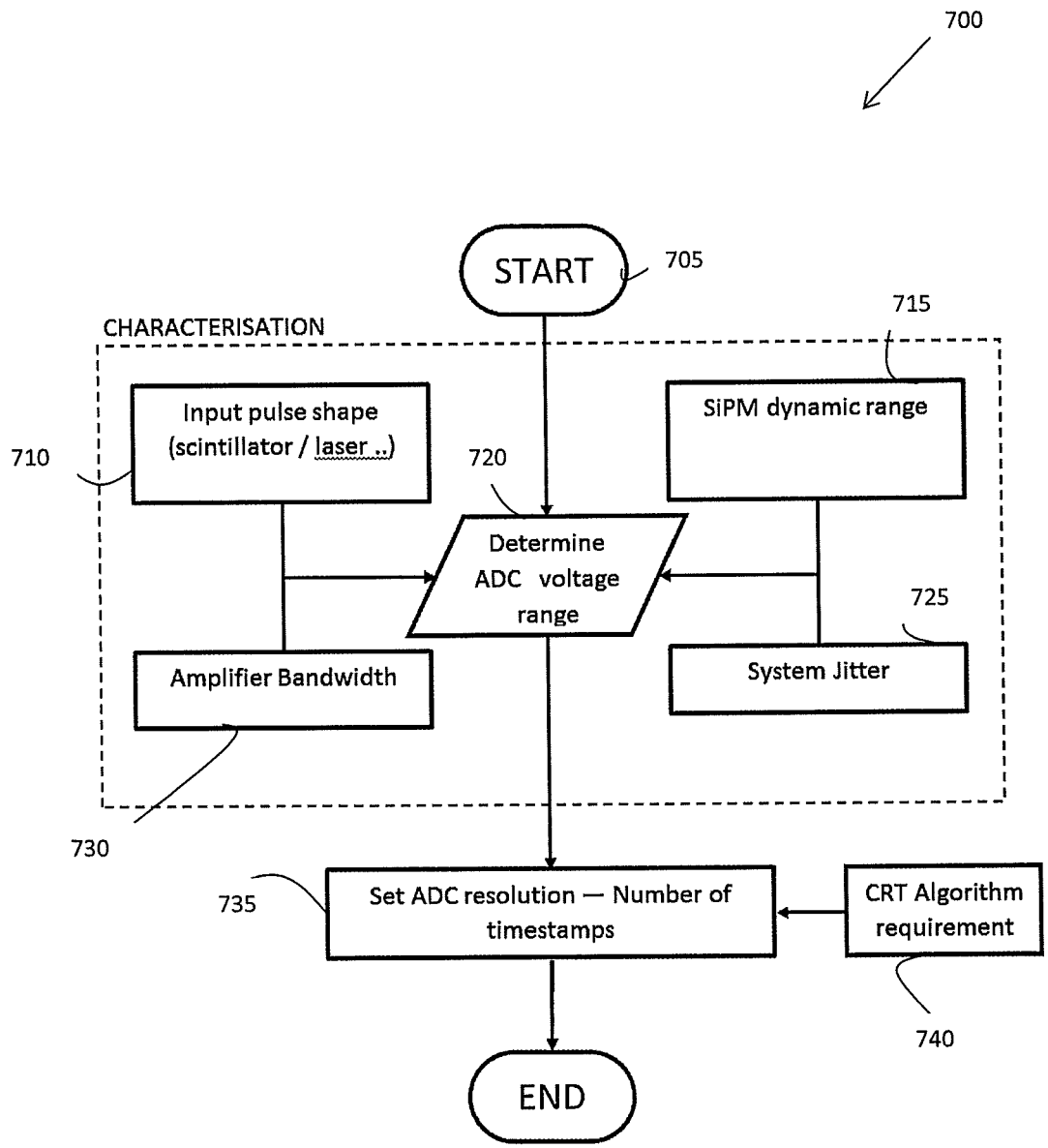
FIG. 7 is a flow chart illustrating exemplary steps of the CRT readout circuit of FIG. 6 in operation.

FIG. 7 illustrates exemplary steps for configuring the flash ADC 615. The ADC voltage range is determined based on number of parameters, block 720. In the exemplary arrangement, the input pulse shape of the laser used in a CRT application is provided as a parameter, block 710. The bandwidth of the amplifier 610 is provided as another parameter, block 730. The dynamic range of the SiPM 605 is provided as a further parameter, block 715. The dymanic range is the ratio between maximum input detectable and minimum input detectable.

System jitter is also provided as a parameter, block 725. Block 720 determines the ADC voltage range using the parameters provided by blocks 710, 715, 725 and 730. It will be appreciated that other parameters may be used for determining the ADC voltage range other than those described with reference to blocks 710, 715, 725, and 730. In block 735 the ADC voltage range from block 720 is used to set the ADC resolution in addition to predefined CRT algorithm requirements provided by block 740.

It will be appreciated by those skilled in the art that by the characterization of the system, i.e. light source, sensor and amplifier, the operating voltage range may be determined. The maximum and minimum values of the voltage range are then used to configure the ADC 615. The number of timestamps obtained, i.e. the resolution of the ADC 615 may be chosen according to the algorithm for CRT extraction. The number of timestamps from the TDC 620 needs to be "sufficient" to reach the ideal Cramer limit, therefore it can be set to a high value (100+). This multi-threshold approach eliminates the need of tuning the single threshold setting through a voltage sweep as illustrated in the traditional approach of FIG. 5 since the useful range of voltages from the ADC 615 operates in parallel. All these timestamps from the TDC 620 may be arranged to feed dedicated CRT algorithms proven to reach the minimum CRT values.

The present disclosure provides means to obtain multiple timestamps from the analogue SiPM signal allowing the analogue SiPM signals to be better exploited in CRT measurements. The output of the analogue SiPM 605 is a signal whose amplitude depends on the incident light coming, in CRT measurement, from a scintillator. Setting different analogue thresholds using the ADC 615 enables multiple timestamping without the need of digitization circuity being provided on the SiPM 605. The flash ADC 615 divides a certain range of voltages into a series of intervals according to their resolution and the output of each level can be timestamped by the TDC 620. In this way, as many timestamps as ADC bits may be obtained. Compared to a single-mode of operation as described with reference to the readout circuit 300, where only one threshold is active, the multiple threshold mode of operation, where up-to-N levels are enabled in parallel, the CRT measurement is proved to show a lower standard deviation increasing therefore the CRT measurement quality as illustrated in solid line in the graph in FIG. 4.

It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

What is claimed is:

1. A coincidence resolving time (CRT) readout circuit comprising:
   an analog SiPM sensor for detecting photons and generating an analog SiPM output signal, said analog SiPM sensor comprising a summed array of Geiger mode photodiodes electrically connected to a common electrode, wherein outputs of the Geiger mode photodiodes are summed to form the analog SiPM output signal on the common electrode;
   an ADC for converting the analog SiPM output signal to digital values according to corresponding ones of multiple threshold values; and
   a time to digital converter configured to receive the digital values from the ADC and timestamp them.

2. The CRT readout circuit as claimed in claim 1, further comprising an amplifier for amplifying the analog SiPM output signal in advance of the analog SiPM output signal being received by the ADC.

3. The CRT readout circuit as claimed in claim 1, wherein the ADC is a flash ADC.

4. The CRT readout circuit as claimed in claim 1, wherein the ADC is configured to have a voltage range.

5. The CRT readout circuit as claimed in 4, wherein the voltage range is determined based on a plurality of parameters.

6. The CRT readout circuit as claimed in claim 5, wherein at least one of the parameters is associated with a parameter of a CRT application.

7. The CRT readout circuit as claimed in claim 5, wherein at least one of the parameters is associated with a characteristic of a scintillator.

8. The CRT readout circuit as claimed in claim 5, wherein at least one of the parameters is associated with a characteristic of a laser pulse shape.

9. The CRT readout circuit as claimed in claim 5, wherein at least one of the parameters is associated with a bandwidth of an amplifier.

10. The CRT readout circuit as claimed in claim 5, wherein at least one of the parameters is associated with a dynamic range of the analog SiPM sensor.

11. The CRT readout circuit as claimed in claim 5, wherein at least one of the parameters is associated with system jitter.

12. The CRT readout circuit as claimed in claim 5, wherein the voltage range of the ADC is used to set an ADC resolution in addition to a plurality of predefined CRT algorithm requirements.

13. The CRT readout circuit as claimed in claim 1, wherein a number of timestamps from the time to digital converter is sufficient to reach an ideal Cramer limit.

14. The CRT readout circuit as claimed in claim 1, wherein all the number of timestamps from the time to digital converter feed dedicated algorithms proven to reach minimum CRT values.

15. The CRT readout circuit as claimed in claim 1, wherein the analog SiPM sensor is a single-photon sensor.

16. The CRT readout circuit as claimed in claim 1, wherein the analog SiPM sensor comprises a matrix of micro-cells.

17. A coincidence resolving time readout circuit comprising:

an analog SiPM sensor for detecting photons and generating an analog SiPM output signal on an output thereof, said analog SiPM sensor comprising a summed array of Geiger mode photodiodes electrically connected to a common electrode, wherein outputs of the Geiger mode photodiodes are summed to form the analog SiPM output signal on the common electrode;

an ADC having an input coupled to the output of the analog SiPM sensor, and a plurality of outputs, wherein the ADC converts the analog SiPM output signal to a plurality of digital values provided to corresponding ones of the plurality of outputs according to corresponding ones of multiple threshold values; and a time to digital converter having a plurality of inputs coupled to the plurality of outputs of the ADC, and a plurality of outputs for providing a plurality of timestamps corresponding to the plurality of digital values.

18. The coincidence resolving time readout circuit of claim 17, further comprising an amplifier having an input coupled to the output of the analog SiPM sensor, and an output coupled to the input of the ADC.

19. The CRT readout circuit of claim 17, wherein the ADC is a flash ADC.

* * * * *